(12) United States Patent
Schmidt (10) Patent No.: US 8,209,142 B2
(45) Date of Patent: Jun. 26, 2012

(54) METHOD AND DEVICE FOR TRIGGERING A RECORDING OF A MEASURED SIGNAL

(75) Inventor: Kurt Schmidt, Grafing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 442 days.

(21) Appl. No.: 12/447,780

(22) PCT Filed: Nov. 13, 2007

(86) PCT No.: PCT/EP2007/009806
§ 371 (c)(1),
(2), (4) Date: Apr. 29, 2009

(87) PCT Pub. No.: WO2008/064769
PCT Pub. Date: Jun. 5, 2008

(65) Prior Publication Data
US 2010/0076718 A1    Mar. 25, 2010

(30) Foreign Application Priority Data
Nov. 28, 2006  (DE) .......................... 10 2006 056 151

(51) Int. Cl.
  G01R 13/00      (2006.01)
  G06F 11/00      (2006.01)
(52) U.S. Cl. .............. 702/127; 702/68; 702/66; 702/71; 327/1
(58) Field of Classification Search ................. 702/127, 702/76, 68, 75, 66, 71
See application file for complete search history.

(56) References Cited

U.S. PATENT DOCUMENTS

| | | | |
|---|---|---|---|
| 4,890,237 A | 12/1989 | Bales et al. | |
| 5,103,402 A * | 4/1992 | Morton et al. | 702/76 |
| 6,714,883 B1 * | 3/2004 | Samuels | 702/68 |
| 2003/0220753 A1 * | 11/2003 | Pickerd et al. | 702/67 |
| 2006/0015277 A1 * | 1/2006 | Bernard et al. | 702/76 |
| 2006/0025947 A1 * | 2/2006 | Earls | 702/76 |
| 2008/0130654 A1 * | 6/2008 | Schmidt et al. | 370/395.7 |

FOREIGN PATENT DOCUMENTS

| | | |
|---|---|---|
| DE | 4039648 A1 | 7/1992 |
| EP | 1669764 A1 | 6/2006 |
| WO | 9926073 A1 | 5/1999 |

OTHER PUBLICATIONS

International Search Report, WO 2008/064769 A3, Jun. 2, 2008, pp. 1-8.
International Preliminary Report on Patentability, PCT/EP2007/009806, dated Jul. 16, 2009, pp. 1-11.

* cited by examiner

*Primary Examiner* — Hal Wachsman
(74) *Attorney, Agent, or Firm* — Ditthavong Mori & Steiner, P.C.

(57) ABSTRACT

A device for triggering a recording of a measured signal dependent upon at least one triggering event identifiable in a occurrence distribution of parameter pairs from two mutually-dependent parameters of the measured signal includes a discriminator for the identification of triggering events in each case with one frequency (NofTreffer) determined for the respective parameter pair and, in a first embodiment, disposed outside, and in a second embodiment, disposed inside, an upper and lower threshold value (UpperNofTreffer, LowerNofTreffer) associated with the respective parameter pair and for marking each occurring triggering event with the assistance of an activated first trigger marker (TrigMerk1) associated with the respective parameter pair. A memory is used for buffering at least the upper and lower threshold value (UpperNofTreffer, LowerNofTreffer) for every parameter pair.

20 Claims, 6 Drawing Sheets

METHOD AND DEVICE FOR TRIGGERING A RECORDING OF A MEASURED SIGNAL

CROSS-REFERENCE TO RELATED APPLICATION

The present application claims priority to PCT Application No. PCT/EP2007/009806, filed on Nov. 13, 2007, and German Patent Application No. 10 2006 056 151.1, filed on Nov. 28, 2006, the entire contents of which are herein incorporated by reference.

BACKGROUND OF THE INVENTION

1. Field of the Invention

The invention relates to a method and a device for triggering a recording of a measured signal.

2. Discussion of the Background

Measuring instruments and systems often offer a display of signal-level distributions of a stochastic measured signal via frequency or time, as described, for example, in U.S. Pat. No. 4,890,237. The prior art, as documented, for example, in U.S. Pat. No. 4,890,237, disadvantageously fails to disclose a technical doctrine for the identification of interference-signal components in a stochastic measured signal or, derived from the latter, a triggering for the recording of the measured signal with the interference-signal components contained therein. Alongside the identification of an interference-laden measured signal of this kind, the identification of a correct measured signal freed from interference-signal components with a specification of a reference measured-signal as a technical doctrine complementary to the latter is also not covered by the prior art.

SUMMARY OF THE INVENTION

Embodiments of the present invention therefore advantageously provide a method and a device for identifying the presence or absence of interference-signal components in a stochastic measured signal and, derived from the latter, a triggering for the recording of the measured signal in order to classify the measured signal as a correct or an interference-laden measured signal.

According to embodiments of the invention, the respectively-determined frequency of registered signal levels of the measured signal is compared in a discriminator with an upper and lower threshold value associated with the respective parameter pair in each case within one observation interval for every parameter pair consisting of two mutually-dependent parameters of the measured signal—for example, the signal level range of the measured signal dependent upon the time or frequency of the time or frequency raster used—and, in a first variant of the invention, in the event that the respectively-determined frequency is disposed outside the frequency range defined by the upper and lower threshold value, activates a first trigger marker associated with the respective parameter pair. The upper and lower threshold value associated with the respective parameter pair form a tolerance range for the frequency associated with the respective parameter pair of signal levels of a reference-measured signal to be measured within an observation interval. Accordingly, a frequency value registered outside the tolerance range for a measured signal defined by the lower and upper threshold value represents an indicator for an interference-laden measured signal inside the respective parameter pair.

By analogy, in a second variant of the invention, a first trigger marker associated with the respective parameter pair is activated in the event that the respectively-determined frequency value is disposed inside the lower and upper threshold value. Accordingly, a frequency value registered inside the tolerance range defined by the lower and upper threshold value represents an indicator for a correct, interference-free measured signal within the respective parameter pair.

Alongside these sub-variants, which each form a first sub-variant for the two embodiments, in a second sub-variant of the first variant of the invention, a first logic-comparison unit, which investigates the associated, first trigger markers for every parameter pair of the occurrence distribution within a respective, previously-defined partial range of mutually-adjacent parameter pairs of the occurrence distribution with regard to an activation, is connected downstream of each discriminator, and activates the second trigger marker associated with the respective partial range in the presence of at least one activated, first trigger marker within a partial range.

Figure 8:
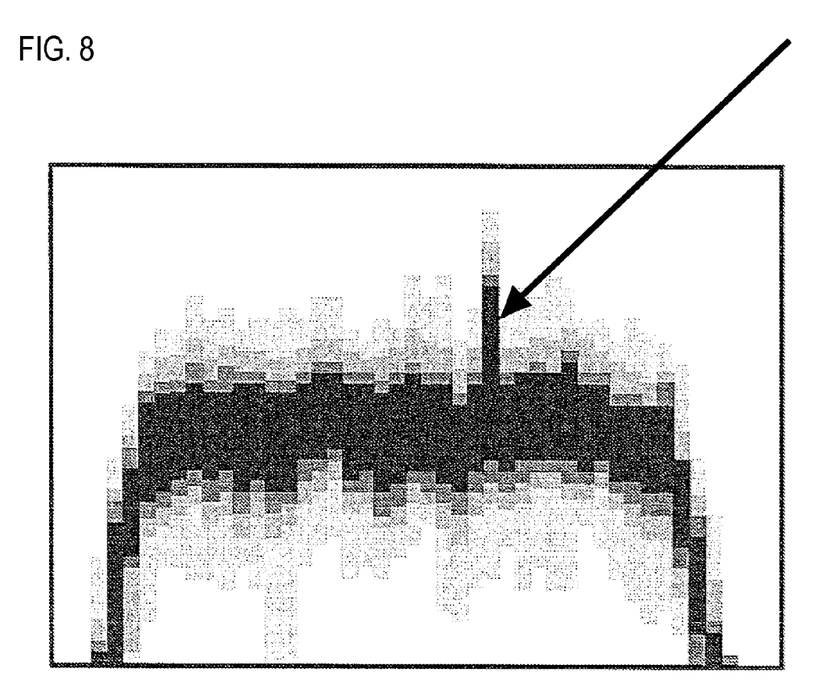
FIG. 8 shows a spectral display of a band-pass signal with a sinusoidal interference signal in a partial range of the occurrence distribution.

In a third sub-variant, a first logic-comparison unit is also connected downstream of the respective discriminator, which, for every parameter pair of the occurrence distribution, compares the associated first trigger markers within a respective, previously-defined partial range of mutually-adjacent parameter pairs of the occurrence distribution to a first reference marker associated with the respective parameter pair of the occurrence distribution for determining an identity between the first trigger marker and the first reference marker, and in the event of at least N parameter pairs of the respective partial range being identical to N associated first reference markers, activates a second trigger marker associated with the respective partial range. By activating first reference markers associated with given parameter pairs of the occurrence distribution, it is possible to identify given interference-signal components in the measured signal. The activation of at least N first reference markers in one column of a partial range of the spectral occurrence distribution of the measured signal allows, for example, the identification of sinusoidal interferers within this partial range of the frequency spectrum of the measured signal (see the sinusoidal interferer marked by the arrow in the enlarged partial range of the occurrence distribution in the frequency spectrum of measured signal in FIG. 8).

If the first trigger markers activated by the discriminator in a first sub-variant of the invention consisting of only one discriminator, and the second trigger markers activated by the first logic-comparison unit of the second and third sub-variant of the invention are supplied respectively to a second logic-comparison unit, the first and second trigger markers associated respectively with each parameter pair of the occurrence distribution are each compared with a second reference marker for determining an identity between the first trigger marker and the second reference marker and an identity between the second trigger marker and the second reference marker associated respectively with each parameter pair of the occurrence distribution, and, in the event of identity in at least N parameter pairs or respectively in at least N partial ranges, a triggering of the recording of the measured signal is started. With the activation of second reference markers, it is possible to realize any required logical links between the individual first and second trigger markers even over several successive observation intervals.

BRIEF DESCRIPTION OF THE DRAWINGS

The following section explains embodiments of the method according to the invention and the device according to the invention for triggering a recording of a measured signal in detail with reference to the drawings. The drawings are as follows.

DETAILED DESCRIPTION OF EXEMPLARY EMBODIMENTS OF THE INVENTION

Figure 1:
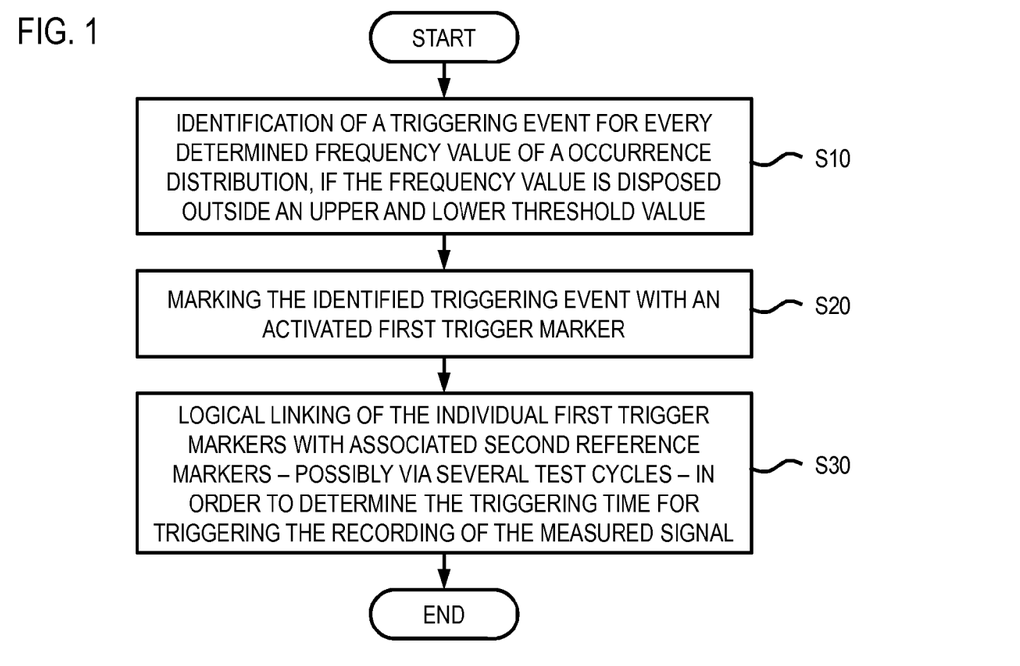
FIG. 1 shows a flow chart of a first sub-variant of a first embodiment of the method according to the invention for triggering a recording of a measured signal.

The following section describes the first sub-variant of the first embodiment of the method according to the invention for triggering a recording of measured signal with reference to the flow chart of FIG. 1.

Figure 5:
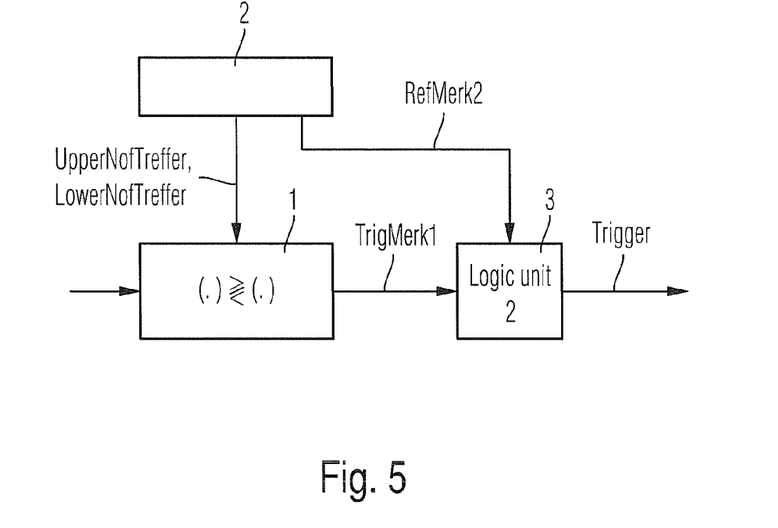
FIG. 5 shows a block-circuit diagram of a first embodiment of the device according to the invention for triggering a recording of a measured signal.

In the first procedural stage S10, in a discriminator 1 of the first embodiment of the device according to the invention for triggering a recording of a measured signal as shown in FIG. 5, for every determined frequency value NofTreffer of a occurrence distribution of parameter pairs of a measured signal, the presence of a triggering event is determined as follows:

The frequency value NofTreffer determined for each parameter pair, for example, from one signal-level range and respectively one value of the time or frequency raster used, is compared with an upper and lower threshold value UpperNofTreffer, LowerNofTreffer specified for the respective parameter pair. The upper and lower threshold values UpperNofTreffer, LowerNofTreffer specified in each case for every parameter pair and stored in a memory 2 of the device according to the invention can be determined in advance, by determining in a reference measurement for a reference-measured signal with a signal characteristic identical to the measured signal, in each case the maximum and minimum value of all frequency values NofTreffer determined in each of the individual observation intervals over a given measurement period. If the determined frequency value NofTreffer is disposed outside the frequency value range defined by the upper and lower threshold value UpperNofTreffer, LowerNofTreffer, the measured signal to be measured differs from the reference-measured signal in the respectively-observed parameter pair. The difference between the measured signal and the reference-measured signal in the respective parameter pair represents a triggering event for the respective parameter pair.

In the next procedural stage S20, a first trigger marker TrigMerk1 associated with the respective parameter pair is activated in the discriminator 1 for every triggering event identified for the respective parameter pair.

In the next and final procedural stage S30, in a second logic-comparison unit 3 of the first embodiment of the device according to the invention as shown in FIG. 5, every first trigger marker TrigMerk1 respectively activated or not activated for each parameter pair is compared with regard to identity with a second reference marker RefMerk2 associated with the respective parameter pair, activated by the user and stored in the memory 2 of the device according to the invention as shown in FIG. 5.

The use of second reference markers RefMerk2 in this context allows a determination of the difference between the measured signal and the reference-measured signal in several parameter pairs of the occurrence distribution selected by the user, which represent the entire characteristic of the signal level of the measured signal over all values of the time or frequency raster used.

The difference between the first trigger markers TrigMerk1 and second reference marker RefMerk2 over several parameter pairs of the occurrence distribution of the measured signal can be determined not only over one observation interval, but over several observation intervals, in order to achieve a relatively higher significance in the difference between measured signal and reference-measured signal. If identity predominates between at least N activated first trigger markers TrigMerk1 and the associated N second reference markers RefMerk2 activated by the user, and accordingly a difference exists between the measured signal and the reference-measured signal, a triggering time for triggering the recording of the measured signal is therefore present, and a corresponding trigger signal Trigger is activated. By selecting the value N, the user can specify in how many parameter pairs a difference between measured signal and reference-measured signal must be present in order to start a triggering of the recording of the measured signal.

Figure 2:
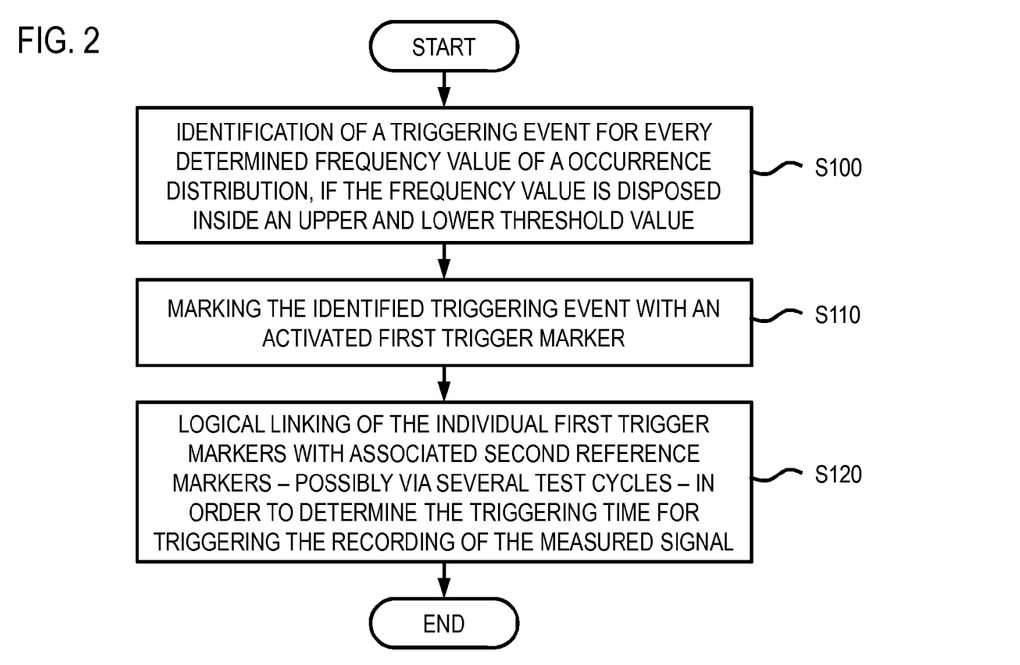
FIG. 2 shows a flow chart of a first sub-variant of a second embodiment of the method according to the invention for triggering a recording of a measured signal.

In the first sub-variant of the second embodiment of the method according to the invention for triggering a recording of a measured signal as shown in the flow chart of FIG. 2, for every parameter pair of the occurrence distribution of the measured signal, it is established in a discriminator 1 of the first embodiment of the device according to the invention as shown in FIG. 5 whether the respectively-determined frequency value NofTreffer is disposed inside the upper and lower threshold UpperNofTreffer, LowerNofTreffer associated with the respective parameter pair. In this manner, it is possible to identify an identity between the registered measured signal and the previously-determined reference-measured signal in the respective parameter pair. If the frequency value NofTreffer determined for the respective parameter pair is disposed inside the upper and lower threshold value UpperNofTreffer, LowerNofTreffer, a triggering event is identified for the respective parameter pair.

By analogy with procedural stage S20 of the first sub-variant of the first embodiment of the method according to the invention for triggering a recording of a measured signal, in the subsequent procedural stage S110 of the first sub-variant of the second embodiment, in the presence of a triggering event associated with the respective parameter pair, the first trigger marker TrigMerk1 associated with the respective parameter pair is activated in the discriminator 1.

In the next and final procedural stage S120, by analogy with procedural stage S30 of the first sub-variant of the first embodiment, every first trigger marker TrigMerk1 associated with the respective parameter pair is compared with the second reference marker RefMerk2 associated with the respective parameter pair in order to determine if they are identical. If identity predominates between the individual activated first trigger markers TrigMerk1 and the associated second reference markers RefMerk2 activated by the user, and accordingly, an identity is present between the measured signal and the associated reference-measured signal in the characteristic of the signal level of the measured signal over all values of the time or frequency raster used, then a triggering time for the triggering of the recording of the measured signal is present, and a corresponding trigger signal Trigger is activated. By analogy with the first sub-variant of the first embodiment, the individual, activated first trigger markers TrigMerk1 can also be compared with the associated second reference markers RefMerk2 activated by the user in order to increase the significance of the identity between the measured signal and the reference-measured signal over several observation intervals.

Figure 3:
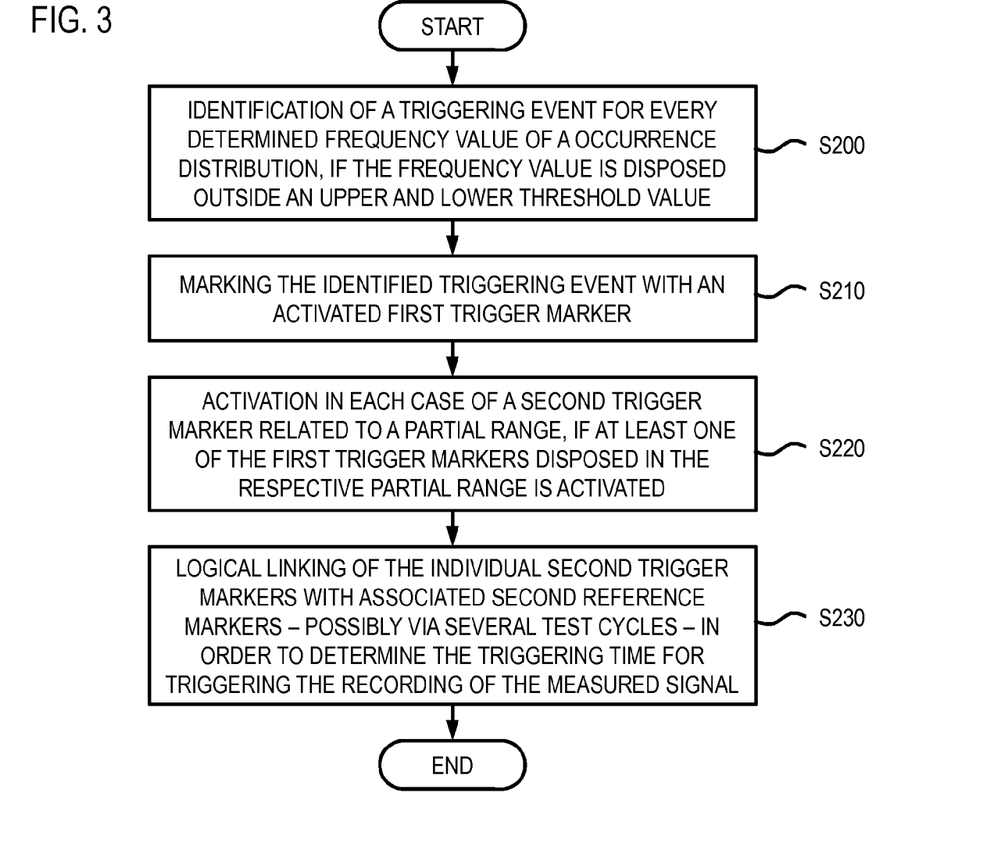
FIG. 3 shows a flow chart of a second sub-variant of the first embodiment of the method according to the invention for triggering a recording of a measured signal.

The second sub-variant of the first embodiment of the method according to the invention for triggering a recording of a measured signal in FIG. 3 corresponds in its first two procedural stages S200 and S210 to the first two procedural stages S10 and S20 of the first sub-variant of the first embodiment of the method according to the invention and consequently determines whether the frequency value NofTreffer determined for the respective parameter pair is disposed outside the frequency-value range, which is defined by the upper and lower threshold value UpperNofTreffer, LowerNofTreffer associated with the respective parameter pair, and a triggering event associated with the respective parameter pair is therefore present. In the presence of a triggering event associated with the respective parameter pair, the first trigger marker TrigMerk1 associated with the respective parameter pair is activated.

Figure 6:
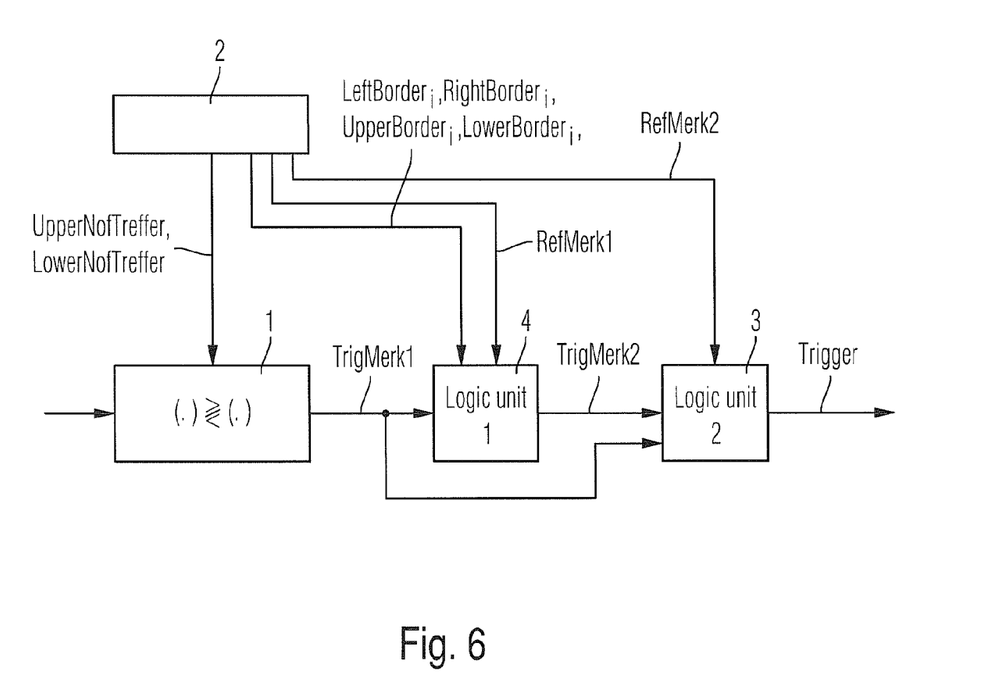
FIG. 6 shows a block-circuit diagram of a second embodiment of the device according to the invention for triggering a recording of a measured signal.

In the subsequent procedural stage S220, in a first logic-comparison unit 4 of the second embodiment of the device according to the invention as shown in FIG. 6, it is established for every previously-determined partial range of the occurrence distribution, whether at least one first trigger marker TrigMerk1 is activated within the respective partial range of the occurrence distribution. If this is the case, a difference between the measured signal and the reference-measured signal is present at least within the limits of the respective partial range of the occurrence distribution, and a second trigger marker TrigMerk2 marking the difference and associated with the respective partial range is activated. The definition of the individual partial ranges of the occurrence distribution are specified in advance by the user by indicating the limits of the partial range, which are also stored in the memory 2 of the device according to the invention as shown in FIG. 6. For the sake of simplicity, rectangular partial ranges i are defined by indicating the left, upper and lower partial-range limits $RightBorder_i$, $LeftBorder_i$, $UpperBorder_i$, $LowerBorder_i$.

Figure 7A:
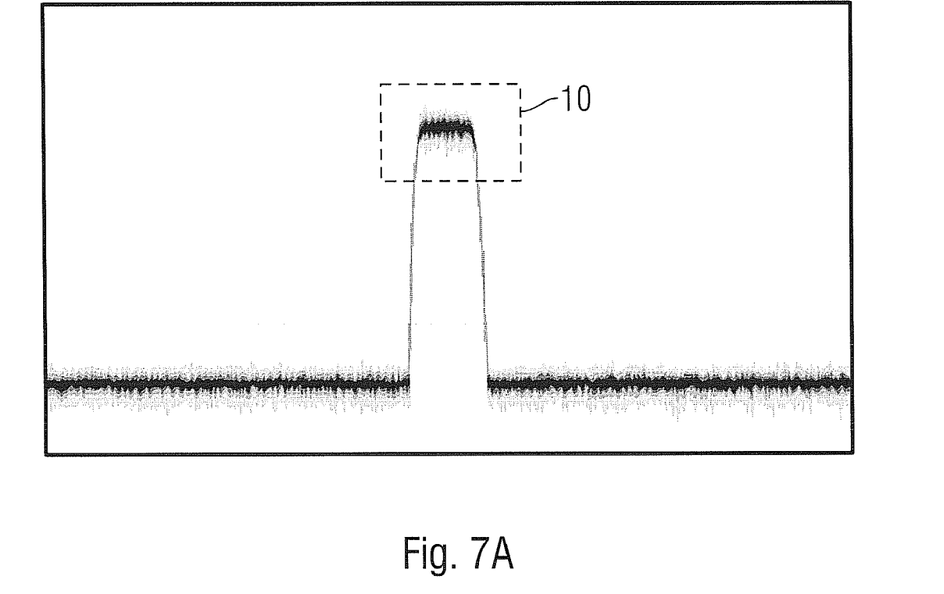
FIGS. 7A and 7B show a spectral display of a band-pass signal with partial ranges of the occurrence distribution in a second and respectively third sub-variant of the two embodiments of the method according to the invention and in the case of the second embodiment of the device according to the invention for triggering a recording of a measured signal.
Figure 7B:
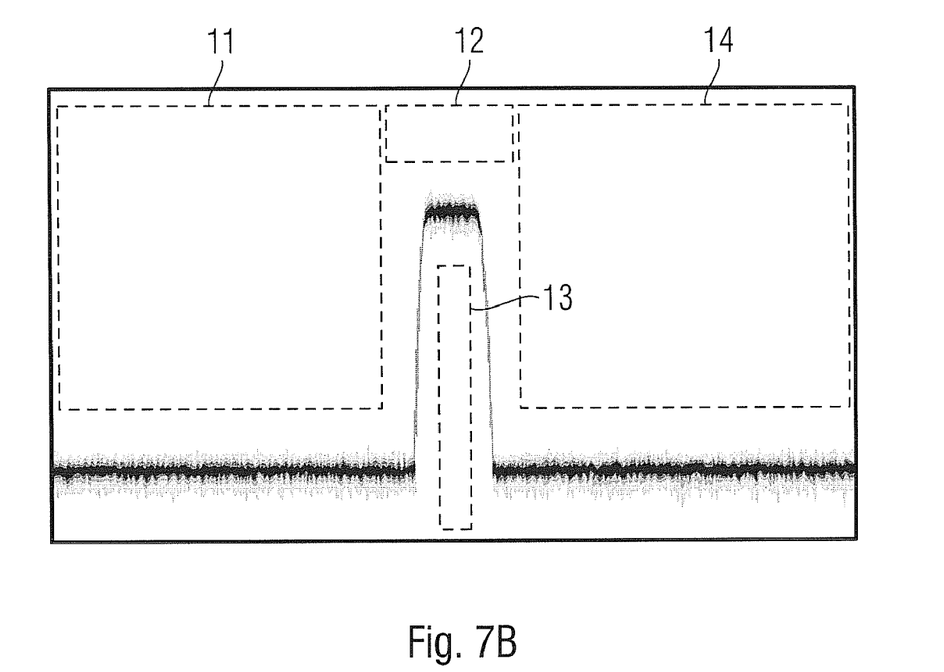

FIG. 7A illustrates by way of example a partial range 10 for determining an identity or difference between measured signal and reference-measured signal corresponding to the first or second embodiment of the method according to the invention. FIG. 7B shows by way of example the partial ranges 11, 12, 13 and 14 for determining only one difference between measured signal and reference-measured signal corresponding to the first embodiment of the method according to the invention.

In the next and final procedural stage S230, by analogy with procedural stage S30 of the first sub-variant of the first embodiment of the method according to the invention, all of the second trigger markers TrigMerk2 associated with the respective partial range are checked with regard to identity with the second reference markers RefMerk2 associated with the respective partial range selected by the user and stored in the memory 2 in order to determine if they are identical. This identity check can also extend over several observation intervals. If an activated, second trigger marker TrigMerk2 and an associated second reference marker RefMerk2 activated by the user are identical in at least N partial ranges of the occurrence distribution, and accordingly the measured signal differs from the associated reference-measured signal in at least N partial ranges of the occurrence distribution, a triggering time for triggering the recording of the measured signal has occurred, and the associated triggering signal Trigger is activated. By selecting the value N, the user can specify, in how many partial ranges of the occurrence distribution a difference between the measured signal and the reference-measured signal must be present until a triggering of the recording of the measured signal is started.

Figure 4:
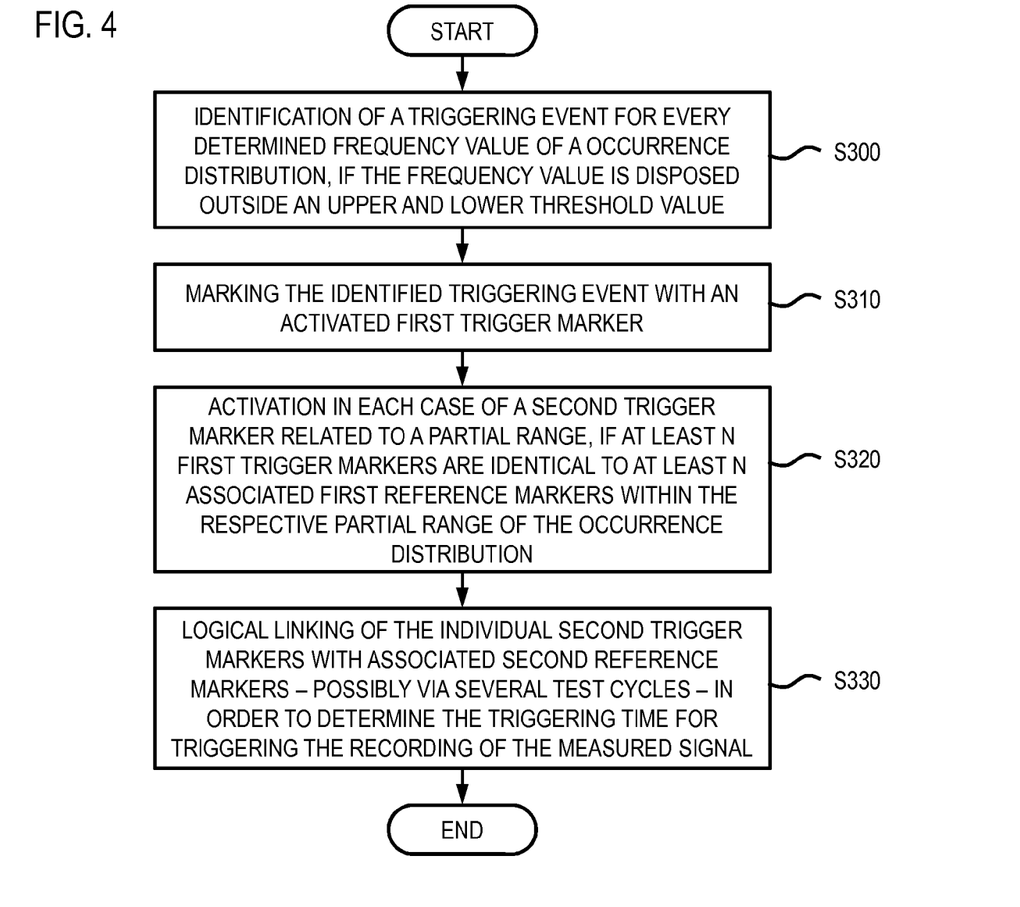
FIG. 4 shows a flow chart of a third sub-variant of the first embodiment of the method according to the invention for triggering a recording of a measured signal.

The third sub-variant of the first embodiment of the method according to the invention for triggering a recording of a measured signal in FIG. 4 corresponds in the first two procedural stages S300 and S310 to the first two procedural stages S10 and S20 of the first sub-variant of the first embodiment of the method according to the invention.

The first trigger marker TrigMerk1 activated for the respective parameter pair of the occurrence distribution in procedural stage S310 in the event of a presence of a frequency value NofTreffer associated with the respective parameter pair outside the frequency-value range of the respective parameter pair defined by the upper and lower threshold value UpperNofTreffer, LowerNofTreffer is compared in the next procedural stage S320 with an associated first reference marker RefMerk1 activated by the user. If LowerNofTreffer and the associated first reference marker RefMerk1 are identical in at least N activated, first trigger markers TrigMerk1 of a respective, previously-defined partial range of the occurrence distribution for the at least N associated first reference markers RefMerk1 activated by the user, then a difference exists in at least N parameter pairs of the associated partial region of the occurrence distribution between the measured signal and the associated reference-measured signal, and a second trigger marker TrigMerk2 associated with the respective partial range is activated. By selecting the value N, the user can specify the required number of differences between measured signals and the associated reference-measured signal existing respectively in a parameter pair, which is necessary for the activation of the triggering.

In the next and final procedural stage S330, by analogy with procedural stage S30 of the first sub-variant of the first embodiment of the method according to the invention, every second trigger marker TrigMerk2 associated with the respective partial range is checked with regard to identity with the second reference marker RefMerk2 associated with the respective partial range activated by the user. This identity check can also extend over several observation intervals. If every second trigger marker TrigMerk2 associated with the respective partial range is identical with the second reference marker RefMerk2 in at least N partial ranges of the occurrence distribution, and accordingly, if the measured signal differs from the associated reference-measured signal in at least N partial ranges of the occurrence distribution, a triggering time for triggering the recording of the measured signal has occurred, and the associated triggering signal Trigger is activated.

A third sub-variant for the second embodiment of the method according to the invention for triggering a recording of a measured signal is obtained from the combination of procedural stages S10 and S20 of the first sub-variant for the second embodiment of the method according to the invention as shown in FIG. 1 with procedural stages S320 and S330 of the third sub-variant for the first embodiment of the method according to the invention as shown in FIG. 4, wherein the identity comparison in procedural stages S320 and S330 over at least N first trigger markers TrigMerk1 and at least N associated first reference markers RefMerk1 is replaced by an identity comparison over all first trigger markers TrigMerk1 and all associated first reference markers RefMerk1.

The invention is not restricted to the embodiments and sub-variants illustrated. Instead of the determination of the lower and upper threshold values UpperNofTreffer, LowerNofTreffer associated with the individual parameter pairs via a previously-implemented reference measurement with a reference-measured signal, it is also possible to refer back to spectral distributions of measured signals known a priori. The identification and synchronization of a burst signal by means of a deterministic synchronization sequence can accordingly be replaced, in the case of a previously-known spectral distribution of a burst signal, by the method according to the invention and the device according to the invention, wherein only the statistical properties of the measured signal are exploited.

The invention claimed is:

1. A device for triggering a recording of a measured signal dependent upon at least one triggering event identifiable in an occurrence distribution of parameter pairs of two mutually-dependent parameters of the measured signal, said device comprising:
a discriminator configured to identify a triggering event for each parameter pair, a determined occurrence of which is disposed outside an upper and lower threshold value associated with the parameter pair, and configured to mark each occurring triggering event with the assistance of an activated, first trigger marker associated with the parameter pair; and
a memory configured to buffer at least the upper and lower threshold value for every parameter pair.

2. The device for triggering a recording of a measured signal according to claim 1, further comprising a first logic-comparison unit configured to identify at least one activated first trigger marker in at least one partial range of mutually-adjacent parameter pairs and to activate a second trigger marker associated with the partial range with at least one identified activated first trigger marker connected downstream of the discriminator.

3. The device for triggering a recording of a measured signal according to claim 2, further comprising a second logic-comparison unit configured to compare several first or second trigger markers with an associated activated second reference marker triggering the recording of the measured signal in the event of at least N first or second trigger markers being identical to the N associated activated second reference markers and connected downstream of the discriminator or of the first logic-comparison unit,
whereby N is a number of parameter pairs with a difference between the measured signal and a reference measured signal being necessary to start the triggering of the recording of the measured signal.

4. The device for triggering a recording of a measured signal according to claim 1, further comprising a first logic-comparison unit configured to compare several first trigger markers with associated activated first reference markers in at least one partial range of mutually-adjacent parameter pairs for identity and to activation of a second trigger marker associated with the partial range with at least N first trigger markers being identical to the N associated activated first reference markers connected downstream of the discriminator,
whereby N is a number of parameter pairs with a difference between the measured signal and a reference measured signal being necessary to start the triggering of the recording of the measured signal.

5. The device for triggering a recording of a measured signal according to claim 4, further comprising a second logic-comparison unit configured to compare several first or second trigger markers with associated activated second reference markers and triggering the recording of the measured signal in the event of at least N first or second trigger markers being identical to the N associated activated second reference markers connected downstream of the discriminator or of the first logic-comparison unit.

6. A device for triggering a recording of a measured signal dependent upon at least one triggering event identifiable in an occurrence distribution of parameter pairs of two mutually-dependent parameter pairs of the measured signal, said device comprising:
a discriminator configured to identify a triggering event for each parameter pair, a determined occurrence of which is disposed inside an upper and lower threshold value associated with the parameter pair and configured to mark each occurring triggering event with the assistance of an activated, first trigger marker associated with the parameter pair; and
a memory configured to buffer at least the upper and lower threshold value for every parameter pair.

7. The device for triggering a recording of a measured signal according to claim 6, further comprising a first logic-comparison unit configured to identify at least one activated first trigger marker in at least one partial range of mutually-adjacent parameter pairs and to activate a second trigger marker associated with the partial range with at least one identified activated first trigger markers connected downstream of the discriminator.

8. The device for triggering a recording of a measured signal according to claim 7, further comprising a second logic-comparison unit configured to compare several first or second trigger markers with the associated activated second reference markers and triggering the recording of the measured signal in the event of at least N first or second trigger markers being identical to the N associated activated second reference markers connected downstream of the discriminator or of the first logic-comparison unit,
whereby N is a number of parameter pairs with a difference between the measured signal and a reference measured signal being necessary to start the triggering of the recording of the measured signal.

9. The device for triggering a recording of a measured signal according to claim 6, further comprising a first logic-comparison unit configured to compare several first trigger markers with associated activated first reference markers in at least one partial range of mutually-adjacent parameter pairs and for the activation of a second trigger marker associated with the partial range with at least N first trigger markers being identical to the N associated activated first reference markers connected downstream of the discriminator, whereby N is a number of parameter pairs with a difference between the measured signal and a reference measured signal being necessary to start the triggering of the recording of the measured signal.

10. The device for triggering a recording of a measured signal according to claim 9, further comprising a second logic-comparison unit configured to compare several first or second trigger markers with one associated activated second reference markers and triggering the recording of the measured signal in the event of at least N first or second trigger markers being identical to the N associated activated second reference markers is connected downstream of the discriminator or of the first logic-comparison unit.

11. A method for triggering a recording of a measured signal dependent upon at least one triggering event identifiable in an occurrence distribution of parameter pairs of two mutually-dependent parameters of the measured signal, said method comprising:
   identifying a triggering event for each parameter pair, a determined occurrence of which is disposed outside an upper and lower threshold value associated with the parameter pair, and
   marking each occurring triggering event with the assistance of an activated first trigger marker associated with the parameter pair.

12. The method for triggering a recording of a measured signal according to claim 11, further comprising:
   identifying at least one activated first trigger marker in at least one partial range of mutually-adjacent parameter pairs; and
   activating a second trigger marker associated with the partial range with at least one identified activated first trigger marker.

13. The method for triggering a recording of a measured signal according to claim 12, further comprising:
   comparing several first or second trigger markers with an associated activated second reference marker; and
   triggering the recording of the measured signal in the event of at least N first or second trigger markers being identical to the N associated activated second reference markers,
   whereby N is a number of parameter pairs with a difference between the measured signal and a reference measured signal being necessary to start the triggering of the recording of the measured signal.

14. The method for triggering a recording of a measured signal according to claim 11, further comprising:
   comparing several first trigger markers with associated activated first reference markers in at least one partial range of mutually-adjacent parameter pairs for identity; and
   activating a second trigger marker associated with the partial range with at least N first trigger markers being identical to the N associated activated first reference markers,
   whereby N is a number of parameter pairs with a difference between the measured signal and a reference measured signal being necessary to start the triggering of the recording of the measured signal.

15. The method for triggering a recording of a measured signal according to claim 14, further comprising:
   comparing several first or second trigger markers with associated activated second reference markers; and
   triggering the recording of the measured signal in the event of at least N first or second trigger markers being identical to the N associated activated second reference markers.

16. A method for triggering a recording of a measured signal dependent upon at least one triggering event identifiable in an occurrence distribution of parameter pairs of two mutually-dependent parameters of the measured signal, said method comprising:
   identifying a triggering event for each parameter pair, a determined occurrence of which is disposed inside an upper and lower threshold value associated with the parameter pair; and
   marking each occurring triggering event with the assistance of an activated first trigger marker associated with the parameter pair.

17. The method for triggering a recording of a measured signal according to claim 16, further comprising:
   identifying at least one activated first trigger marker in at least one partial range of mutually-adjacent parameter pairs; and
   activating a second trigger marker associated with the partial range with at least one identified activated first trigger marker.

18. The method for triggering a recording of a measured signal according to claim 17, further comprising:
   comparing several first or second trigger markers with activated second reference markers; and
   triggering the recording of the measured signal in the event of at least N first or second trigger markers being identical to the N associated activated second reference markers,
   whereby N is a number of parameter pairs with a difference between the measured signal and a reference measured signal being necessary to start the triggering of the recording of the measured signal.

19. The method for triggering a recording of a measured signal according to claim 16, further comprising:
   comparing several first trigger markers with associated activated first reference markers in at least one partial range of mutually-adjacent parameter pairs; and
   activating a second trigger marker associated with the partial range with at least N first trigger markers being identical to the N associated activated first reference markers,
   whereby N is a number of parameter pairs with a difference between the measured signal and a reference measured signal being necessary to start the triggering of the recording of the measured signal.

20. The method for triggering a recording of a measured signal according to claim 19, further comprising:
   comparing several first or second trigger markers with associated activated second reference markers; and
   triggering the recording of the measured signal in the event of at least N first or second trigger markers being identical to the N associated activated second reference markers.

* * * * *